US007424276B2

(12) United States Patent
Yamawaki et al.

(10) Patent No.: US 7,424,276 B2
(45) Date of Patent: Sep. 9, 2008

(54) TRANSMITTER AND WIRELESS COMMUNICATION APPARATUS USING THE TRANSMITTER

(75) Inventors: Taizo Yamawaki, Kokubunji (JP); Hisayoshi Kajiwara, Kokubunji (JP); Ryoichi Takano, Kodaira (JP); Patrick Wurm, Hertfordshire (GB)

(73) Assignees: Renesas Technology Corp., Tokyo (JP); TTPCOM Limited, Hertfordshire (GB)

( * ) Notice: Subject to any disclaimer, the term of this patent is extended or adjusted under 35 U.S.C. 154(b) by 136 days.

(21) Appl. No.: 10/509,753

(22) PCT Filed: Feb. 18, 2003

(86) PCT No.: PCT/GB03/00778

§ 371 (c)(1),
(2), (4) Date: Sep. 30, 2004

(87) PCT Pub. No.: WO03/103162

PCT Pub. Date: Dec. 11, 2003

(65) Prior Publication Data

US 2005/0176388 A1     Aug. 11, 2005

(30) Foreign Application Priority Data

May 31, 2002   (EP)   .................................... 0212740

(51) Int. Cl.
*H04B 1/04* (2006.01)

(52) U.S. Cl. ................ 455/114.3; 455/63.1; 455/67.13; 455/108; 455/114.2; 455/102; 333/167; 333/172

(58) Field of Classification Search .................. 455/39, 455/126, 295, 522, 42, 501, 63.1, 67.13, 455/570, 102, 108, 110, 114.1–114.3, 118, 455/67.11, 307–308; 331/135; 375/332, 375/376, 297, 345; 330/129, 51, 285; 333/167–185
See application file for complete search history.

(56) References Cited

U.S. PATENT DOCUMENTS 4,501,002 A * 2/1985 Auchterlonie ................ 375/332

(Continued)

FOREIGN PATENT DOCUMENTS

JP      2004-7443     1/2004

(Continued)

OTHER PUBLICATIONS

Buchwald, "A 6-GHz integrated phase-locked loop using AlGaAs/GaAs heterojunction bipolar transistors", vol. 27 Issue: Dec. 12, 1992, pp. 1752-1762.*

(Continued)

*Primary Examiner*—Nay Maung
*Assistant Examiner*—Junpeng Chen
(74) *Attorney, Agent, or Firm*—Antonelli, Terry, Stout & Kraus, LLP.

(57) ABSTRACT

In a transmitter of polar-loop architecture having a phase control loop and an amplitude control loop, as loop filters for controlling a loop band of the amplitude control loop, a first filter with lag-lead characteristics (secondary or more filter including a capacitor and a resistor) and a second filter of a perfect integrator type (filter including only a capacitor) are employed, and current-output type circuits are connected to respective front stages of the first and second filters.

10 Claims, 10 Drawing Sheets

U.S. PATENT DOCUMENTS

| | | | |
|---|---|---|---|
| 5,469,105 A * | 11/1995 | Sparks | 330/129 |
| 5,715,527 A * | 2/1998 | Horii et al. | 455/126 |
| 5,854,971 A * | 12/1998 | Nagoya et al. | 455/126 |
| 6,636,114 B2 * | 10/2003 | Tsutsui et al. | 330/51 |
| 6,671,337 B1 * | 12/2003 | Cordoba | 375/345 |
| 6,766,156 B1 * | 7/2004 | Hayashihara | 455/295 |
| 6,801,784 B1 * | 10/2004 | Rozenblit et al. | 455/522 |
| 6,853,836 B2 * | 2/2005 | Asam et al. | 455/126 |
| 7,053,723 B2 * | 5/2006 | Fredriksson | 331/135 |
| 7,085,335 B2 * | 8/2006 | Rawlins et al. | 375/346 |
| 2002/0051508 A1 * | 5/2002 | Tachimori | 375/376 |
| 2002/0090921 A1 * | 7/2002 | Midtgaard et al. | 455/126 |
| 2003/0095608 A1 * | 5/2003 | Duperray | 375/297 |
| 2003/0224740 A1 | 12/2003 | Takano et al. | |
| 2003/0224749 A1 | 12/2003 | Uozumi et al. | |
| 2004/0061554 A1 | 4/2004 | Kajiwara et al. | |
| 2005/0218989 A1 * | 10/2005 | Tsutsui et al. | 330/285 |
| 2006/0166619 A1 * | 7/2006 | Roberts | 455/39 |

FOREIGN PATENT DOCUMENTS

| | | |
|---|---|---|
| JP | 2004-7445 | 1/2004 |
| JP | 2004-120306 | 4/2004 |

OTHER PUBLICATIONS

T. Yamawaki, et al., "A 2.7-V GSM RF Transceiver IC", IEEE Journal of Solid-State Circuits, vol. 32, No. 12, Dec. 1997, pp. 2089-2096.

B. Razavi, "RF MicroElectronics", Prentice Hall Ptr Press. pp. 149-155.

P. Kenington, "High-Linearity RF Amplifier Design", Artech House Press, pp. 161-164.

Office Action dated Feb. 9, 2007 issued in corresponding Chinese patent application (No. 03807554.7); an English translation of the Chinese Action.

* cited by examiner

TRANSMITTER AND WIRELESS COMMUNICATION APPARATUS USING THE TRANSMITTER

BACKGROUND OF THE INVENTION

The present invention relates to a technique for facilitating reduction in noise and a design of a loop filter relative to a transmitter which has a high frequency power amplifier and performs a control of an output power by a feedback control, and particularly to a technique effectively applied to a transmitter having a phase control loop and a technique effectively applied to an amplitude control loop for performing a phase modulation and an amplitude modulation and a wireless communication apparatus using this transmitter such as a mobile phone.

In a mobile phone, needs of a high-speed data communication in addition to a speech communication have been increased in recent years. In GSM (Global System for Mobile communications) that is one of European Mobile Communications Standards, on the basis of a conventional system using a GMSK (Gaussian Minimum Shift Keying) modulation architecture, GPRS (General Packet Radio Service) for speeding up a data communication has been decided by allowing a plurality of time slot transmissions for one time slot transmission in the GSM with multiplexing TDMA (Time Division Multiple Access) architecture. Further, in order to realize a data speed exceeding the GPRS, a standardization of EDGE (Enhanced Data for GSM Evolution) using 8-PSK as a modulation architecture has been made.

Since an amplitude of a GMSK modulated signal is constant, as a transmission architecture of a mobile phone for GSM, an offset PLL architecture for outputting a signal having a constant amplitude is generally used. Further, in the offset PLL architecture, since an input amplitude is constant, as a power amplifier for amplifying a signal with a predetermined gain, a high efficient nonlinear power amplifier is widely used. The operating principle of the transmitter of the offset PLL architecture is described in, for example, IEEE journal of solid-state circuits, Vol. 32, No. 12, December 1997, "A 2. 7-V GSM RF transceiver IC", pp. 2089-2096.

On the other hand, since the amplitude of the modulated signal in the 8-PSK modulation of the EDGE system is not constant, a linear transmission capable of being transmitted without distortion of not only an input signal phase but also an amplitude is required for the transmission architecture. As a way to realize the linear transmission, two architectures have been known. The first architecture is a mixer architecture for performing a frequency conversion by a mixer, where a linear power amplifier is employed. Details of the mixer architecture are described in, for example, "RF MICROELECTRONICS", pp. 149-155 by Behard Razavi, PRENTICE HALL PTR Press. The second architecture is an architecture in which a nonlinear power amplifier is employed and a distortion compensation is applied thereto, and thereby a high efficient nonlinear power amplifier can be used. As examples of the above-mentioned architecture, there are a polar-loop architecture, a Cartesian-loop architecture, a Predistortion architecture, and the like.

In the EDGE system, nine modes of MSC1 to MSC9 are, however, prescribed according to an amount of transmission data, and the modes each have a different error correcting code architecture, and a mobile phone for EDGE has to be configured so as to be capable of operating in all the modes. The modes of MSC1 to MSC4 among the nine modes of MSC1 to MSC9 relate to the GMSK modulation while the modes of MSC5 to MSC9 relate to the 8-PSK modulation. In other words, the mobile phone for EDGE has to be a mobile phone for dual mode capable of performing two modulations of the GMSK modulation and the 8-PSK modulation.

In order to realize the dual mode transmission, when the first architecture using the above-mentioned mixer is applied to both the GMSK modulation and the 8-PSK modulation, there is an advantage of reduction in area by sharing a circuit while there is a disadvantage of reduction in power efficiency because of use of the linear power amplifier. On the other hand, when the above-mentioned offset PLL architecture is employed for the GMSK modulation and the first architecture is employed for the 8-PSK modulation, there is an advantage of the case where high power efficiency is obtained while there is a disadvantage of the case where an area increases because a circuit such as a power amplifier or the like cannot be used in common therewith.

Therefore, the second architecture capable of using the nonlinear power amplifier is preferable in that the power efficiency is improved while the polar-loop architecture in the second architecture is particularly advantageous in that many circuits can be used in common with the offset PLL architecture.

FIG. 7 is a diagram showing a conventional example of a transmitter for polar-loop architecture. The above-mentioned transmitter has a phase loop and an amplitude loop.

The amplitude loop is configured with a nonlinear power amplifier 200 having an I/O terminal and an amplitude control terminal; signal branching means 201 for branching an output signal of the nonlinear power amplifier 200 into a first and second outputs; an attenuator 102 for attenuating the signal branched by the signal branching means 201; a mixer 103 to which the signal attenuated in the attenuator 102 is supplied; a voltage-controlled oscillator (VCO) 104 generating a local signal for causing the mixer 103 to perform a frequency conversion operation; a filter 105 for suppressing undesired harmonics included in the output of the mixer 103; an amplitude detector 130 for detecting an amplitude difference between a feedback signal FB and a reference modulated signal (MOD); and a low pass filter 111.

A signal (OUT) being output from the nonlinear power amplifier 200 of the above-mentioned transmitter is output to an antenna (not shown) via the signal branching means 201. An output signal of the low pass filter 111 is supplied to the amplitude control terminal of the nonlinear power amplifier 200 as an output control signal VAPC, and an output amplitude of the nonlinear power amplifier 200 is controlled such that the amplitudes of the feedback signal FB and the reference modulated signal (MOD) become equal. Further, an output signal (carrier) $\phi$TX of the transmission oscillator (VCO) 114 is input into the input terminal of the nonlinear power amplifier 200. The amplitude of the signal (carrier) $\phi$TX supplied to the input terminal of the nonlinear power amplifier 200 is constant.

FIG. 8 shows characteristics of the output amplitude to the output control signal VAPC of the nonlinear power amplifier 200 shown in the polar-loop architecture in FIG. 7. A linear area shown in FIG. 8 is used as an operating area of the nonlinear power amplifier 200. Since the filter 105 is directed for suppressing the undesired harmonics included in the output of the mixer 103 and is designed such that a band thereof is generally wider than a loop band of the above-mentioned amplitude loop, the band and a phase margin of the amplitude loop is determined according to the characteristics of the low pass filter 111.

On the other hand, the phase loop in the polar-loop architecture shown in FIG. 7 is configured with the nonlinear power amplifier 200; the signal branching means 201; the attenuator 102; the mixer 103; the local VCO 104; the filter 105; a phase detector 140 for detecting a phase difference between the feedback signal FB and the reference modulated signal (MOD); the low pass filter 113; and the transmission oscillator (VCO) 114, wherein the oscillation operation of the transmission oscillator (VCO) 114 is controlled such that the phases of the feedback signal FB and the reference modulated signal (MOD) are coincided with each other.

As described above, separate control loops are provided for an amplitude component and a phase component of the reference modulated signal (MOD) so that while a modulation spectrum of the reference modulated signal MOD is stored in the output OUT, a center frequency thereof is converted into a desired frequency. The control of the desired frequency described above is performed by setting a frequency of the local VCO 104. Note that details of the operating principle of the polar-loop architecture is described in, for example, "HIGH-LINEARITY RF AMPLIFIER DESIGN", pp. 161-164 by PETER B. KENINGTON, Artech House Press.

In the amplitude loop of the transmitter for polar-loop architecture, in order to compensate for a distortion component generated in the nonlinear power amplifier 200, it is, however, necessary that an open loop transfer function Ho of the above-mentioned amplitude loop has a sufficiently large gain in a low frequency area. Therefore, the design is generally made such that a transfer function F of the low pass filter 111 has a pole (DC pole) at 0 Hz. General design formulas of the transfer function F in the case of one pole (Type I) and of the transfer function F in the case of two poles (Type II) are expressed in formula 1 and formula 2, respectively. In the formulas, each of A and B is constant.

$$F = \frac{A}{S} \quad \text{(Formula 1)}$$

$$F = \frac{B \cdot (s + w_z)}{s^2 \cdot (s + w_p)} \quad \text{(Formula 2)}$$

Formula 1 is a transfer function having one perfect integrator, in which the amplitude loop having the transfer function is stable because a phase thereof is not shifted 90 degrees or more. On the other hand, the filter expressed with formula 2 is configured with one perfect integrator and a secondary passive filter having lag-lead characteristics, in which the gain in the low frequency is increased and the phase margin is increased. The frequency characteristic of each open loop transfer function Ho of Type I and Type II at a loop band of 1.8 MHz is shown in FIG. 9. The zero point and the poles in Type II are arranged symmetrically with respect to respective loop bands, and the phase margin is designed to be 68 degrees. Generally, the phase margin is designed to be 45 degrees or more.

As can be seen from FIG. 9, since the gain in the low frequency area is larger in Type II than in Type I, Type II is more advantageous than Type I in that distortion is reduced and the modulated precision is improved. Further, the gain in a frequency having a higher loop band than the loop band (of 1.8 MHz or more) is lower in Type II than in Type I, which means that the suppression degree of noise generated in the above-mentioned amplitude loop is large, and so Type II is more advantageous for a mobile phone which requires low noise characteristics. Therefore, in the transmitter for polar-loop architecture, it is more advantageous that the low pass filter 111 on the amplitude loop is designed with Type II due to the distortion compensation and the noise suppression.

SUMMARY OF THE INVENTION

However, when the filter having the transfer function like formula 2 is designed, an active filter using an operational amplifier is generally employed in many cases. However, if the active filter including the operational amplifier is used for the low pass filter 111 on the amplitude loop of the transmitter for polar-loop architecture, the operational amplifier itself has a zero point and poles so that it is necessary to consider the zero point and the poles in designing the low pass filter 111. Therefore, there arises a problem that the design becomes complicated.

An object of the present invention is to provide a technique capable of simplifying a design of a low pass filter on an amplitude loop in a transmitter for polar-loop architecture.

Further, another object of the present invention is to optimize a configuration of the low pass filter on the amplitude loop in the transmitter for polar-loop architecture such that a transmission output noise can be reduced.

The above and other objects and novel features of the present invention will be apparent from the description and the accompanying drawings thereof.

In order to achieve a first object, the present invention described above provides a transmitter of polar-loop architecture having a phase control loop and an amplitude control loop, wherein, as loop filters for restricting a loop band of the amplitude control loop, a first filter with lag-lead characteristics (secondary or more filter including a capacitor and a resistor) and a second filter of a perfect integrator type (filter including only a capacitor) are employed, and wherein current-output type circuits are connected to respective front stages of the first filter and the second filter. By doing so, the first filter and the second filter can be configured by a passive filter comprising passive elements, so that an active filter including an operational amplifier is not required, which enables to simplify the design thereof.

In order to achieve the second object, the above-mentioned present invention provides a transmitter of polar-loop architecture having a phase control loop and an amplitude control loop, wherein, as loop filters for restricting a loop band of the amplitude control loop, a first filter with lag-lead characteristics and a second filter of a perfect integrator type are employed, and wherein the first filter is provided at a front stage thereof prior to the second filter. By doing so, a suppression degree relative to noise of the amplitude loop can be improved and thereby a transmitter with low noise can be realized.

DETAILED DESCRIPTION OF THE PREFERRED EMBODIMENTS

Hereinafter, embodiments according to the present invention will be described with reference to the drawings.

Figure 1:
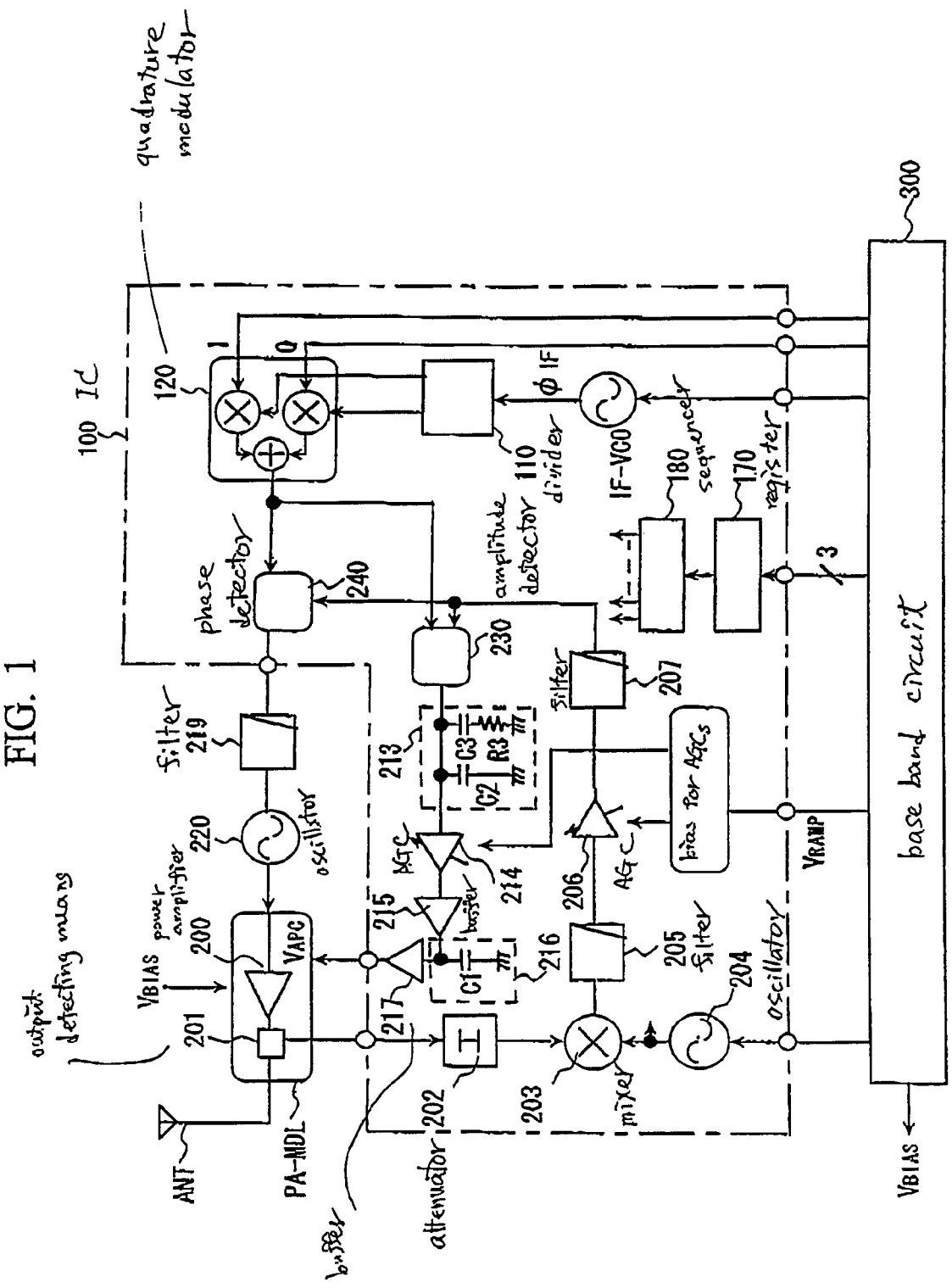
FIG. 1 is a block diagram showing an embodiment of a transmitter according to the present invention.

FIG. 1 is a configuration diagram showing a first embodiment of a transmitter according to the present invention.

The transmitter according to the present embodiment employs a polar-loop architecture described in "BACKGROUND OF THE INVENTION", and has a phase loop and an amplitude loop and is configured as a transmitter for EDGE.

In FIG. 1, numeral 100 denotes a high frequency IC for performing a phase modulation and an amplitude modulation; PA-MDL denotes a power module which includes a nonlinear power amplifier 200 (hereinafter, referred to as a power amplifier) for amplifying and outputting a transmission signal or includes output detecting means 201 such as a coupler or a signal branching device of the like for detecting a transmission output; numeral 300 denotes a base band circuit for generating I/Q signals (base band signals) on the basis of transmission data, or for generating a control signal of the high frequency IC 100 or a bias voltage VBIAS for the power amplifier 200 in the power module PA-MDL; numeral 220 denotes a transmission oscillator for generating a phase modulated transmission signal (carrier); and numeral 219 denotes a filter for restricting a band of a phase control loop and for giving a control voltage of the transmission oscillator 220.

Though not particularly limited, the high frequency IC 100 and the base band circuit 300 are configured as a semiconductor integrated circuit on a single semiconductor chip, respectively. The transmitter according to the present embodiment comprises two control loops of a feedback loop (amplitude loop) for an amplitude control as well as a feedback loop (phase loop) for a phase control. Further, in the present embodiment, a feedback path of the amplitude loop can be also used as a feedback path of the phase loop.

The power module PA-MDL comprises the power amplifier 200, a voltage control circuit for generating a drive voltage (Vdd) of the above-mentioned power amplifier 200, the output detecting means 201, and the like. The power amplifier 200 is configured with a FET or the like. The drive voltage (Vdd) corresponding to a control voltage VAPC supplied from the amplitude loop of the above-mentioned high frequency IC 100, by the voltage control circuit provided in the power module PA-MDL, is generated and applied to a drain terminal or a source terminal of this FET. Further, an appropriate bias voltage VBIAS generated in a bias circuit (not shown) is applied to a gate terminal of the power FET (200). The output detecting means 201 is configured by signal branching means comprising a coupler formed on a module substrate, or a capacitor for branching and propagating only an alternating component of an output, or the like.

The high frequency IC 100 is configured by a phase frequency divider 110 for generating signals whose phases are shifted 90 degrees with respect to each other, from an oscillation signal φIF of an intermediate frequency generated in an oscillator IF-VCO; a quadrature modulator 120 for mixing an I and Q signals supplied from the base band LSI 300 and the frequency-divided signals in the phase frequency divider 110 to perform a quadrature modulation; a phase detector 240 for detecting the phase difference between a feedback signal from the above-mentioned feedback path and an output signal (modulated signal) of the quadrature modulator 120; an attenuator 202 for attenuating a detection signal of the output detecting means 201 for detecting an output level of the power amplifier 200; a mixer 203 for mixing and frequency-converting (down-converting) an attenuated signal and an oscillation signal φRF from a high frequency oscillator 204; a filter 205 for suppressing undesired harmonics in the output of the above-mentioned mixer 203; an automatic gain controlled amplifier (AGC) 206 for amplifying a signal passed through the filter 205; a filter 207 for suppressing undesired harmonics in the output of the automatic gain controlled amplifier 206; an amplitude detector 230 for detecting the amplitude difference between an output signal of the filter 207 and a reference signal from the quadrature modulator 120; a first low pass filter 213 for converting an output current of the amplitude detector 230 to a voltage; an automatic gain controlled amplifier 214 for amplifying an output voltage of the low pass filter 213; a current-output type buffer 215 connected to the automatic gain controlled amplifier 214; a second low pass filter 216 for converting an output current of the current-output type buffer 215 to a voltage; and a buffer 217 for generating and supplying the output voltage VAPC relative to the power amplifier 200 according to the output of the second low pass filter 216.

Further, the high frequency IC 100 according to this embodiment is provided with a register 170 for setting control information or operating modes or the like inside a chip supplied from the base band circuit 300, a sequencer 180 for outputting a timing signal for each circuit inside the chip on the basis of a setting value of the register 170 to operate in a predetermined order according to the operating mode, and the like.

In this embodiment, the amplitude loop is configured by the output detecting means 201, the attenuator 202, the mixer 203, the filter 205, the automatic gain controlled amplifier 206, the filter 207, the amplitude detector 230, the filter 213, the automatic gain controlled amplifier 214, the buffer 215, the filter 216, the buffer 217, and the power amplifier 200. The filters 205 and 207 on the amplitude loop are used for the suppression of undesired harmonics in the respective outputs of the mixer 203 and the automatic gain controlled amplifier 206, and the band thereof is designed to be wider than a loop band of the above-mentioned amplitude loop, so that the band and a phase margin of the above-mentioned amplitude loop are determined by the low pass filters 213 and 216. Further, the phase loop is configured by the output detecting means 201, the attenuator 202, the mixer 203, the filter 205, the automatic gain controlled amplifier 206, the filter 207, the phase detector 240, the filter 219, the transmission oscillator 220, and the power amplifier 200.

In the phase loop, if the phase difference is generated between a modulated signal MOD of the quadrature modulator 120 and the feedback signal from the filter 207, then a voltage for reducing this difference is supplied to a frequency control terminal of the transmission oscillator 220 and the phase of the feedback signal from the filter 207 is controlled to coincide with the phase of the output signal of the quadrature modulator 120. This phase loop controls the transmission oscillator 220 such that the phase of the output thereof is not shifted relative to a supply voltage variation or temperature change. Note that an output amplitude of the transmission oscillator 220 is kept constant.

Figure 7:
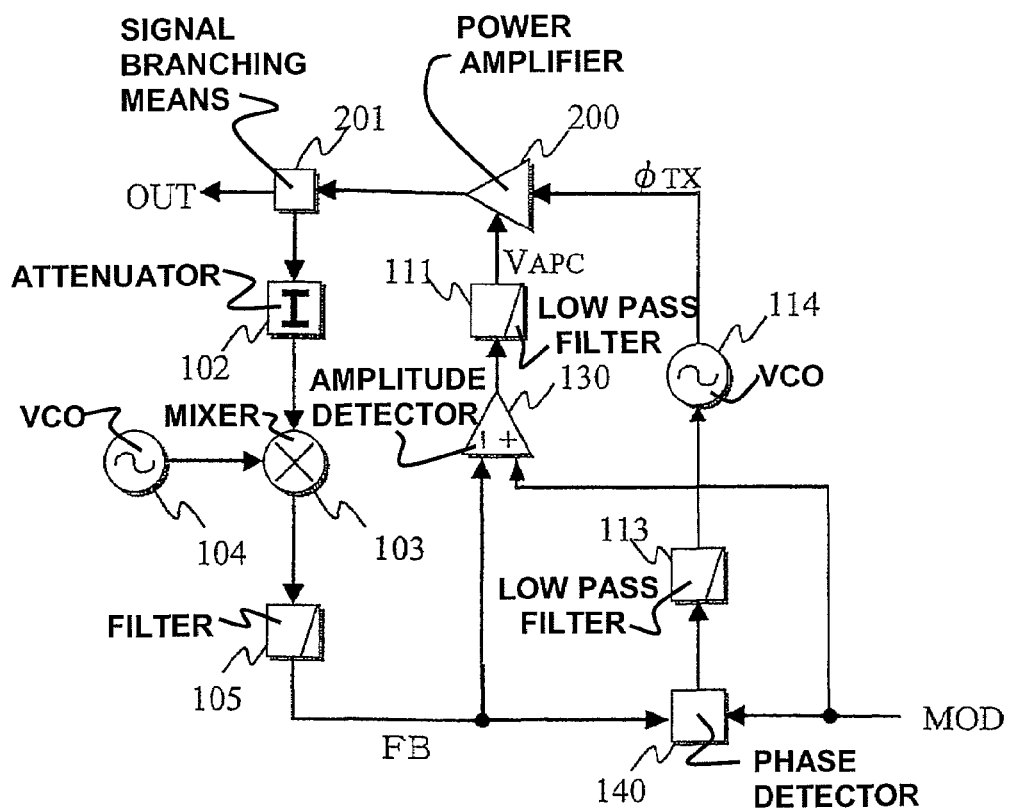
FIG. 7 is a block diagram showing a basic configuration of a transmitter for polar-loop architecture.
Figure 8:
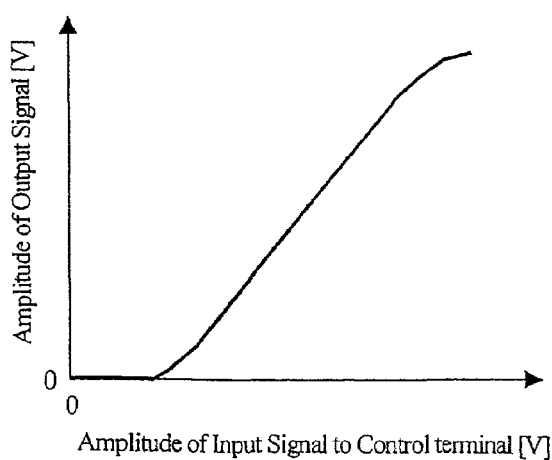
FIG. 8 is a control voltage-output characteristic diagram showing the relationship between an output control voltage VAPC being input into an amplitude control terminal of a nonlinear power amplifier and an output signal level.
Figure 9:
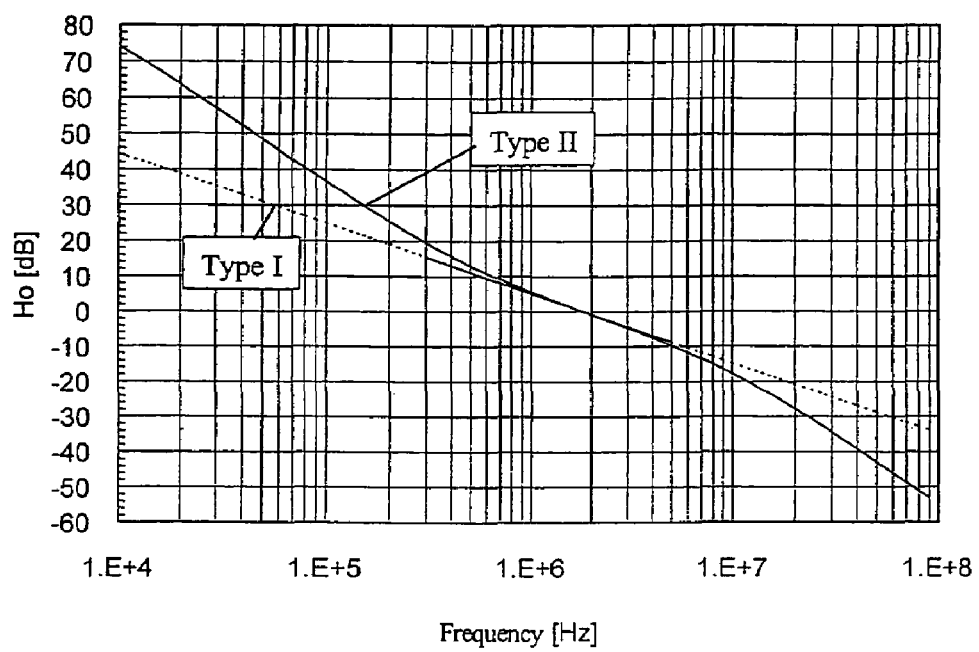
FIG. 9 is a frequency characteristic diagram showing the characteristics of a Type-I filter and a Type-II filter in the form of comparison.

In the present embodiment, a low pass filter 111 in the polar-loop architecture shown in FIG. 7 is configured by two low pass filters 213 and 216 as shown in FIG. 1. At the same time, in order to realize formula 2, the filter 213 is configured by a secondary passive filter having lag-lead characteristics comprising two capacitors C2 and C3 and a resistor R3 connected in series to the capacitor C3, and the filter 216 is configured by a perfect integrator type passive filter comprising only a capacitor C1. Further, in order that the respective low pass filters 213 and 216 can be configured only by passive elements (resistor and capacitor) and an operational amplifier is not required, the front stage circuits of the respective filters are the current-output type circuits, that is, the current-output type amplitude detector 230 and the current-output type buffer 215.

Further, since it is necessary to configure an ideal integrator because of the realization of formula 2, the buffer amplifiers (the current-output type buffer 215 and the buffer 217) are connected to the front stage and a rear stage of the filter 216. As shown in FIG. 1, instead of connecting the filter 216 to the output of the current-output type buffer 215 and connecting the filter 213 to the output of the amplitude detector 230, even when the respective filters are reversed, that is, even when the filter 213 with lag-lead characteristics is connected to the output of the current-output type buffer 215 and the filter 216 is connected to the output of the amplitude detector 230, formula 2 can be realized. However, with respect to an optimization of noise characteristics of the amplitude loop, a filter arrangement shown in FIG. 1 is optimal and details thereof will be described later.

In the polar-loop architecture, since better match obtained at the time when the band of the phase loop is made to be identical to the band of the amplitude loop, in the transmitter according to the present embodiment, the loop filter 219 on the phase loop is configured by the secondary passive filter having lag-lead characteristics comprising two capacitors and one resistor similarly to the filter 213 on the amplitude loop, wherein a constant is set such that the band of the phase loop is restricted to a band identical to the band of the amplitude loop, for example, is as large as 1.8 MHz. However, since the gain of each circuit on the phase loop is different from the gain of each circuit on the amplitude loop, the values of the capacitors and resister of the filter 219 are different from those of the filter 213. Further, in the phase loop, since the oscillator 220 itself has characteristics functioning as the perfect integrator, a filter corresponding to the second filter 216 in the amplitude loop is not required and therefore such a filter is not provided.

Figure 2:
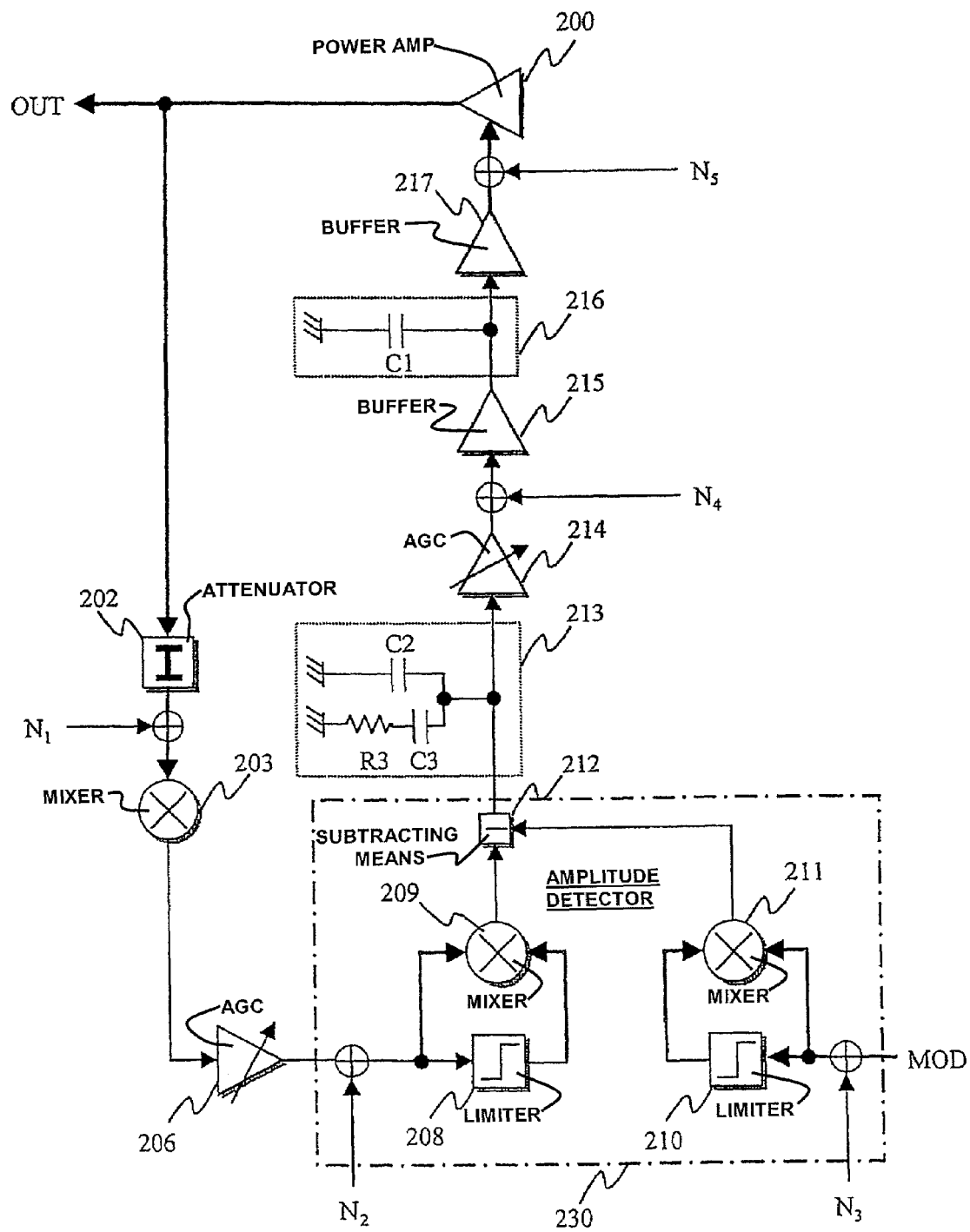
FIG. 2 is a block diagram showing a noise analysis model of the transmitter according to the present invention.

The amplitude detector 230 is configured by, for example, as shown in FIG. 2, a first amplitude detector and a second amplitude detector, and subtracting means 212 for outputting the differential current between the output signal of the first amplitude detector and that of the second amplitude detector. The first amplitude detector comprises a limiter 208 for converting a sine waveform of an input signal to a square waveform and outputting the input signal, and a current-output type mixer 209 for handling the input and the output of the limiter 208, that is, for inputting the sine waveform signal before conversion and the square waveform after conversion, and detects the amplitude of the feedback signal passing through the filter 207. The second amplitude detector comprises a limiter 210 for inputting the modulated signal MOD as the reference signal being output from the modulator 120, and the current-output type mixer 211, and detects the amplitude of the reference modulated signal MOD.

Figure 10:
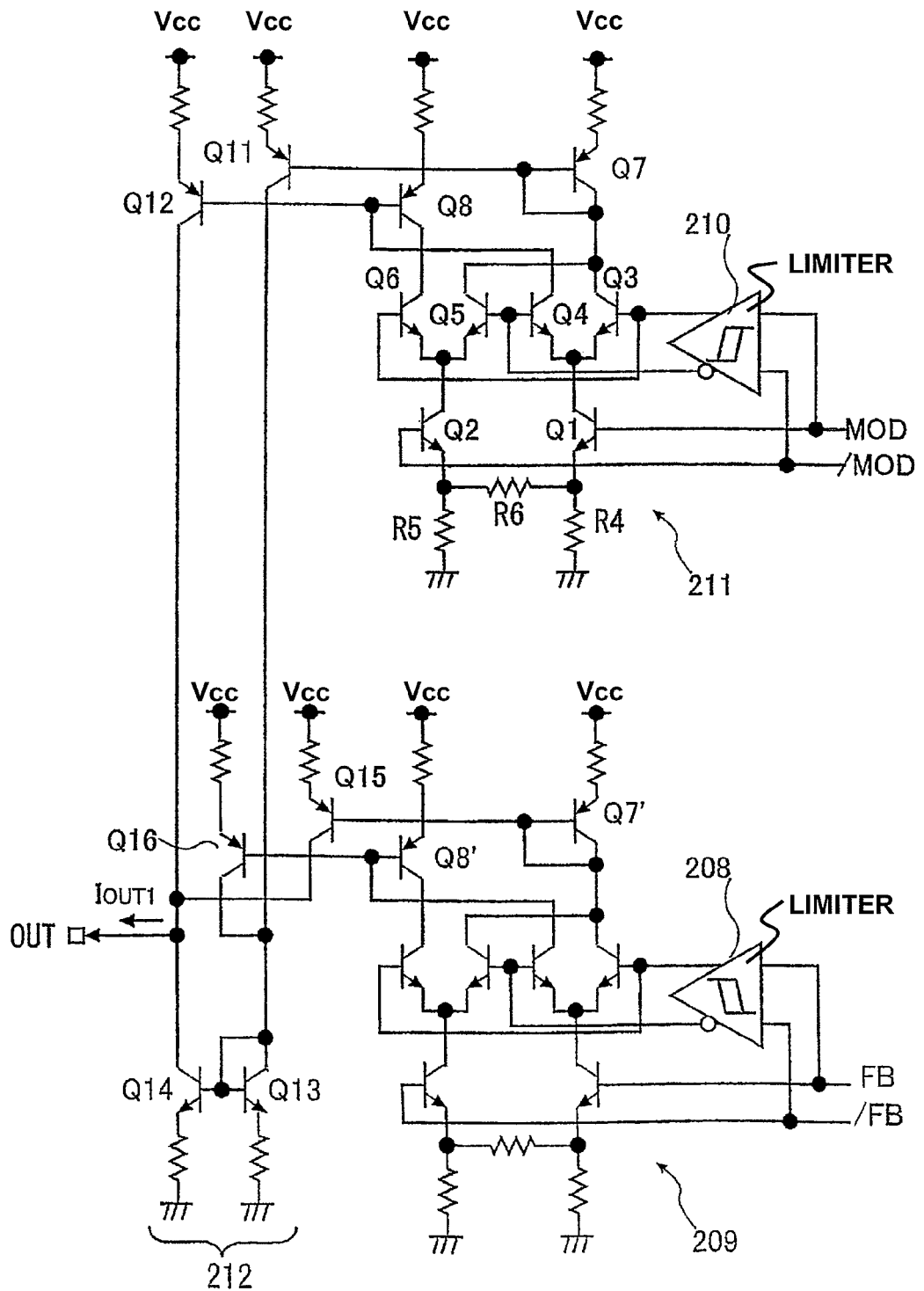
FIG. 10 is a circuit diagram showing a specific example of an amplitude detector used in the embodiments according to the present invention.

FIG. 10 shows a more specific circuit example of the amplitude detector 230. The current-output type mixers 209 and 211 are each configured by one kind of multiplier. In each rear stage of the multipliers is provided a current mirror circuit and the subtracting means 212 for outputting, to a current output terminal OUT, a current IOUT1 in proportion to the amplitude difference between the reference modulated signal MOD and the feedback signal FB by subtracting a current of the current mirror of the current mirror circuit. The mixer 211 is configured by differential pair transistors Q1 and Q2 for each receiving the differential reference modulated signal MOD at the base thereof; resistors R4, R5 and R6 connected to the emitters of Q1 and Q2; differential pair transistors Q3 and Q4 whose common emitter is connected to a collector of the differential pair transistor Q1 and which receives the differential output of the limiter 210 at the base thereof; differential pair transistors Q5 and Q6 whose common emitter is connected to a collector of the differential pair transistor Q2 and which receives the differential output of the limiter 210 at the base thereof; a transistor Q7 connected between a collector of the differential pair transistor Q3 and a supply voltage Vcc; and a transistor Q8 connected between a collector of the differential pair transistor Q6 and the supply voltage Vcc. The mixer 209 has the same circuit configuration as the mixer 211, wherein the feedback signal FB from the amplitude loop is input as an input signal.

The subtracting means 212 is configured by transistors Q11 and Q12 connected to the transistors Q7 and Q8 of the mixer 211 in a current mirror manner; transistors Q13 and Q14 connected in series to the transistors Q11 and Q12 and connected to each other in a current mirror manner; and transistors Q15 and Q16 connected to the transistors Q7' and Q8' of the mixer 209 in a current mirror manner, wherein the transistor Q15 is connected in series to the current mirror transistor Q14 and the transistor Q16 is connected in series to the current mirror transistor Q13.

With such a configuration, the current of the transistor Q7 in the side of the mixer 211 is copied into the transistor Q11 in a current mirror manner, and the current of the transistor Q8' in the side of the mixer 209 is copied into the transistor Q16 in a current mirror manner, and the current added after copy is made to flow through the transistor Q13, and the added current flowing therethrough is copied into the transistor Q14 in a current mirror manner. Further, the current of the transistor Q8 is copied into the transistor Q12 in a current mirror manner, and the current of the transistor Q7' is copied into the transistor Q15 in a current mirror manner, and the current copied into the transistor Q 15 is added to the current copied into the transistor Q12, and the current of the above-mentioned current mirror transistor Q14 is subtracted from this added current so that the current $I_{OUT1}$ in proportion to the amplitude difference between the reference modulated signal MOD and the feedback signal FB is output to the current output terminal OUT.

Figure 11:
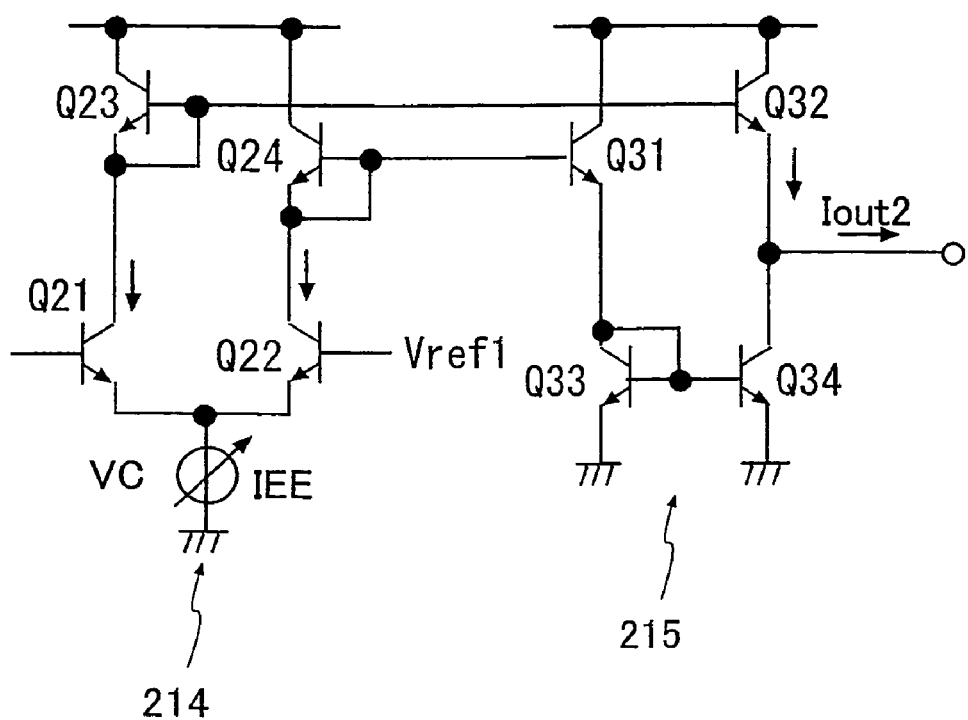
FIG. 11 is a circuit diagram showing a specific example of an automatic gain controlled amplifier and a current-output type buffer used in the embodiments according to the present invention.

FIG. 11 shows a specific circuit example of the automatic gain controlled amplifier 214 and the current-output type buffer 215. The automatic gain controlled amplifier 214 is configured by input differential transistors Q21 and Q22, a variable current source VC connected to a common emitter of the transistors Q21 and Q22, and load transistors Q23 and Q24 connected to the collectors of the transistors Q21 and Q22. The current-output type buffer 215 is configured by transistors Q31 and Q32 connected to the transistors Q23 and Q24 in a current mirror manner, a transistor Q33 connected in series to the transistor Q31, and a transistor Q34 connected in series to the transistor Q32 and connected to the transistor Q33 in a current mirror manner, wherein a current $I_{OUT2}$ obtained by subtracting the current of the transistor Q34 from the current of the transistor Q32 is output. Thereby, the current corresponding to the potential difference between the differential inputs of the automatic gain controlled amplifier 214 is output from the current-output type buffer 215. The output voltage of the filter 213 is input into one of the differential inputs of the automatic gain controlled amplifier 214, and a voltage Vref1 serving as a reference voltage such as 0.1 V is applied to the other of the differential inputs.

Note that the entire circuit shown in FIG. 11 can be regarded as the current-output type automatic gain controlled amplifier 214, in that case the current-output type buffer 215 is not required. Further, the automatic gain controlled amplifier 206 on the feedback path in the polar-loop architecture according to the embodiment may be a circuit in which the load transistors of the automatic gain controlled amplifier 214 shown in FIG. 11 are replaced with resistors. When the automatic gain controlled amplifier 214 (206) is configured by the circuit as shown in FIG. 11, a bias current IEE thereof is exponentially changed so that the gain of the automatic gain controlled amplifier 214 (206), expressed in dB, relative to the control voltage VRAMP can be controlled to linearly change.

Next, as an example of an applied system of the transmitter according to the present embodiment, an operation of an EDGE mode in a frequency band of GSM900 will be described. In the following description, a unit designating a gain will employ not dB but true value.

The transmission frequency band for GSM900 is within the range from 880 MHz to 915 MHz, and the output OUT of the power amplifier 200 is a signal obtained by 8-PSK modulating a carrier having a frequency within the transmission band. In the transmitter according to the embodiment, the modulated signal MOD being output from the quadrature modulator 120 is a 8-PSK modulated signal, and the intermediate frequency thereof can be arbitrarily selected but, in this case, the intermediate frequency is set at 80 MHz. When the amplitude loop and the phase loop of the above-mentioned transmitter converges and comes to the stationary states, the output signal of the filter 207 becomes a replica signal identical to the modulated signal MOD. In other words, it is a signal obtained by being 8-PSK modulated having a carrier frequency of 80 MHz.

On the other hand, since the output signal of the filter 207 is a signal in which the output OUT of the power amplifier 200 is frequency converted in the mixer 203, the output frequency of a local VCO 204 is a frequency obtained by adding 80 MHz to the output frequency of the power amplifier 200, that is, a frequency of 960 MHz to 995 MHz. As the oscillation frequency of the local VCO 204, a frequency obtained by subtracting 80 MHz from the output frequency of the power amplifier 200, that is, a frequency of 800 MHz to 835 MHz may be, however, employed. Further, a frequency divider or a multiplier can be inserted between the local VCO 204 and the mixer 203 to operate the local VCO 204 with higher frequency or lower frequency. The transmission VCO 220 is operated by centering the output frequency of the power amplifier 200 and following the phase signal of the modulated signal MOD, and the output signal thereof is input into the nonlinear power amplifier 200.

In a system for GSM or EDGE, it is required that an antenna output power in transmitting is controlled within a prescribed range. For example, in a terminal for a power class E2, the output power has to be controlled within the range of +5 dBm to +27 dBm per 2 dB step. Therefore, also in the transmitter, it is necessary to correspond to the prescription of the output power control described above. In order to achieve this, the automatic gain controlled amplifier 206 is inserted in the amplitude loop. Hereinafter, the reason why the output power of the power amplifier 200 can be controlled by the automatic gain controlled amplifier 206 will be described.

When the signal amplitude of the modulated signal MOD is designated as VMOD[V] and the stationary error of the amplitude loop is too small not to be ignored, the output signal amplitude of the filter 207 also becomes VMOD. Therefore, when the gain of the automatic gain controlled amplifier 206, the gain of the mixer 203, and the gain of the attenuator 202 are designated as AAGC1, AMIX, and AATT, respectively, and if it is assumed that the attenuation of the signals by the filters 205 and 207 and the signal branching means 201 is not made, then the signal amplitude VOUT[V] of the output OUT of the power amplifier 200 can be expressed as formula 3.

$$V_{OUT} = V_{MOD}/(A_{ATT} \cdot A_{MIX} \cdot A_{AGC1}) \qquad \text{(Formula 3)}$$

From formula 3, it is found that, by controlling the gain AAGC1 of the automatic gain controlled amplifier 206, the output amplitude VOUT of the power amplifier 200 can be controlled to be a desired value.

Next, as described above, description will be made of problems arising in the case where the output amplitude VOUT of the power amplifier 200 is changed by controlling the gain AAGC1 of the automatic gain controlled amplifier 206, and description will be made of solutions for fixing the problems. The amplitude detectors 209 and 210 have the same characteristics, and the gain thereof is designated as ADET. Further, is the gain of the subtracting means 212 is designated as "1" and a transfer function of the filter 213 is designated as F1 and the gains of the automatic gain controlled amplifier 214 and the current-output type buffer 215 are designated as AAGC2 and ABUF1, respectively and the transfer function of the filter 216 is designated as F2 and the gain of the buffer 217 and the gain from the amplitude control terminal of the power amplifier 200 to the output thereof are designated as ABUF2 and APA, respectively, then an open loop transfer function Ho of the above-mentioned amplitude loop is expressed as formula 4.

$$H_o = A_{ATT} \cdot A_{MIX} \cdot A_{AGC1} \cdot A_{DET} \cdot F_1 \cdot A_{AGC2} \cdot A_{BUF1} \cdot F_2 \cdot A_{BUF2} \cdot A_{PA} \qquad \text{(Formula 4)}$$

The characteristics such as the loop band, the phase margin, and the like of the amplitude loop can be determined by the open loop transfer function Ho. Therefore, it is preferable that the transfer function Ho is kept constant irrespective of the signal amplitude of the output OUT of the power amplifier 200, but it is found from formula 4 that if the gain AAGC1 is changed in order to control the signal amplitude of the output OUT of the power amplifier 200, then the transfer function Ho is also changed. This is a problem arising from the AAGC1 control. In order to solve the problem, in the transmitter according to the present embodiment, the automatic gain controlled amplifier 214 is inserted on a forward path of the amplitude loop so that a product of the respective gains of the automatic gain controlled amplifier 206 and the automatic gain controlled amplifier 214, that is, AAGC1×AAGC2 is controlled to become always constant. If AAGC1×AAGC2 is kept constant, as can be seen from formula 4, then the characteristics of the transfer function Ho can be kept. constant even if the AAGC1 is changed. This is necessary in order to keep the amplitude loop bandwidth always constant.

Next, an arrangement of the filters 213 and 216 and the noise characteristics of the amplitude loop in the transmitter according to the embodiment will be described. As a noise calculation model of the amplitude loop, a linear model shown in FIG. 2 is employed. In order to simplify the calculation, influences due to the filter 205 and 207 and the signal branching means 201 will be ignored.

A noise N1[V] designates a sum of an output conversion noise of the attenuator 202 and an input-referred noise of the mixer 203; a noise N2[V] designates a sum of the output-referred noise of the automatic gain controlled amplifier 206 and the input-referred noise of the first amplitude detector (208, 209); a noise N3[V] designates a sum of the input-referred noise of the second amplitude detector (210, 211) and a noise from the front stage circuit of the second amplitude detector; a noise N4[V] designates a sum of the output-referred noise of the automatic gain controlled amplifier 214 and the input-referred noise of the current-output type buffer 215; and a noise N5[V] designates a sum of the output-referred noise of the buffer 217 and an amplitude control terminal referred noise of the power amplifier 200, respectively. The entire output noises of the amplitude loop are obtained by multiplying the noises N1 to N5 by the respective closed loop transfer functions to the amplitude loop output. Now, if it is assumed that the respective closed loop transfer functions relative to the noises N1 to N5 are designated as HN1 to HN5, then these can be expressed as formula 5 to formula 9.

$$H_{N1} = \frac{A_{MIX} \cdot A_{AGC1} \cdot A_{DET} \cdot F_1 \cdot A_{AGC2} \cdot A_{BUF1} \cdot F_2 \cdot A_{BUF2} \cdot A_{PA}}{1 + H_0}$$ (Formula 5)

$$H_{N2} = \frac{A_{DET} \cdot F_1 \cdot A_{AGC2} \cdot A_{BUF1} \cdot F_2 \cdot A_{BUF2} \cdot A_{PA}}{1 + H_0}$$ (Formula 6)

$$H_{N3} = \frac{A_{DET} \cdot F_1 \cdot A_{AGC2} \cdot A_{BUF} \cdot F_2 \cdot A_{BUF2} \cdot A_{PA}}{1 + H_0}$$ (Formula 7)

$$H_{N4} = \frac{A_{AGC2} \cdot A_{BUF1} \cdot F_2 \cdot A_{BUF2} \cdot A_{PA}}{1 + H_0}$$ (Formula 8)

$$H_{N5} = \frac{A_{PA}}{1 + H_0}$$ (Formula 9)

By using formula 5 to formula 9, there will be considered two possibilities of the arrangement of the filters 213 and 216, that is, the case (arrangement 1) where the filter 213 and the filter 216 are arranged as shown in FIG. 1 and the case where the filter 213 and 216 are replaced with each other in position, namely, the case (arrangement 2) where the filter 216 is arranged at the position of the filter 213 in FIG. 1 and the filter 213 is arranged at the position of the filter 216.

Formula 5 to formula 9 correspond to the closed loop transfer functions in the case of the arrangement 1. In the case of the arrangement 2, relative to formula 5 to formula 9, F1 and F2 are replaced with each other, that is, F2 is substituted in place of F1 and F1 is substituted in place of F2. as can be seen from formula 4, since one each of F1 and F2 is included in the transfer function Ho, change in characteristics thereof does not occur even if F1 and F2 are exchanged. From the similar reason, with respect to the transfer functions HN1, HN2, HN3, and HN5, even if F1 and F2 are exchanged, the change in characteristics thereof does not occur. However, with respect to the transfer function HN4, since only one F2 is included in the numerator and F1 is not included therein, change in characteristics thereof occurs if F1 and F2 are exchanged. In order to suppress the noise, it is advantageous that the gain of the closed loop transfer function is smaller. Therefore, it is found that, when one having a smaller gain out of F1 and F2 is included in the numerator of the transfer function HN4, the output noise of the transmitter can be made smaller.

Here, which gain of F1 and F2 is smaller will be considered. In an initial stage where the amplitude loop is converging from the non-stationary state to the stationary state, the current-output type buffer 215 and the subtracting means 212 supply the maximum output currents thereof to the respective filters 216 and 213, and stop supplying the maximum output currents when an input potential of the buffer 217 and the input potential of the automatic gain controlled amplifier 214 are close to the vicinity of the convergence potential, and shift to a convergence process described in a linear model. In the case where the current-output type buffer 215 and the subtracting means 212 are realized on the same IC chip, since the convergence time is advantageously reduced as the maximum output current is larger, the IC chip is designed such that the buffer 215 and the means 212 have the same value within the practical range which can be realized on the IC chip. Further, at this time, the convergence time is advantageously reduced in the case where a slewing rate of a circuit comprising the filter 213 and the subtracting means 212 and a slewing rate of a circuit comprising the filter 216 and the current-output type buffer 215 are the same. Therefore, nearly equal values are employed for the capacitors C1 and C3. Here, in the case of the secondary filter 213 having lag-lead characteristics comprising the capacitors C2 and C3 and the resistor R3 as shown in FIG. 2, since the value of the capacitor C3 becomes ordinarily about one digit larger than that of the capacitor C2, the capacity value of the filter 213 can be represented by the capacitor C3.

Figure 3:
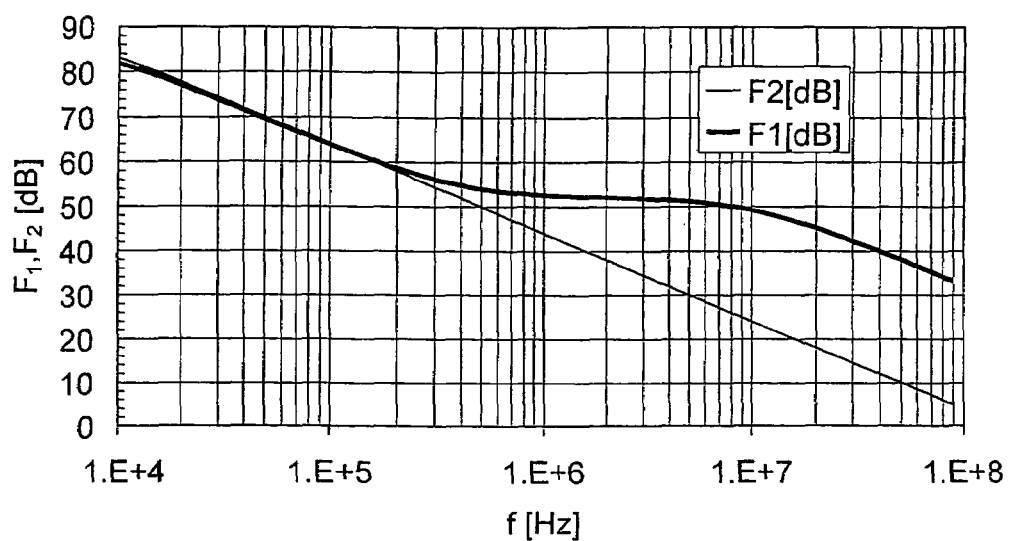
FIG. 3 is a frequency characteristic diagram showing characteristics of a first filter and a second filter in the form of comparison.

FIG. 3 shows the characteristics of the transfer functions F1 and F2 of the filter 213 and the filter 216 when C1 and C3 each have the same value and when the loop band is set at 1.8 MHz. From FIG. 3, it is found that, in the high frequency area, F2 has smaller gain. Therefore, a noise suppressed degree is increased when F2 is included rather than the F1 is in the numerator of the transfer function HN4 of formula 8. In other words, with respect to the arrangements of F1 and F2, arrangement 1 according to this embodiment is more appreciate than arrangement 2 described above in terms of the noise suppression characteristics thereof.

Further, the transmitter according to the present embodiment functions effectively even in the case of the operating mode in which the GMSK modulation is performed. In other words, since the modulated signal MOD having a constant amplitude is supplied from the quadrature modulator 120 in the GSM mode, the output voltage of the power amplifier 200 can be also controlled by keeping the amplitude loop in the operating state and by getting the gain of the automatic gain controlled amplifier 206 changed according to the output request level. For example, in the case where it is desired to increase the output voltage of the power amplifier 200, by making smaller the gain of the automatic gain controlled amplifier 206, the amplitude detector 230 determines that the output amplitude is small, and thereby the control voltage VAPC for increasing the output voltage is applied to the output control terminal of the power amplifier 200 via the amplitude loop, so that the output voltage is made larger. On the contrary, if the gain of the automatic gain controlled amplifier 206 is made larger, then the amplitude detector 230 determines that the output amplitude is large and thereby the control voltage VAPC for lowering the output voltage is applied to the output control terminal of the power amplifier 200 so that the output voltage is made smaller.

Next, a second embodiment of the transmitter according to the present invention will be described.

Figure 4:
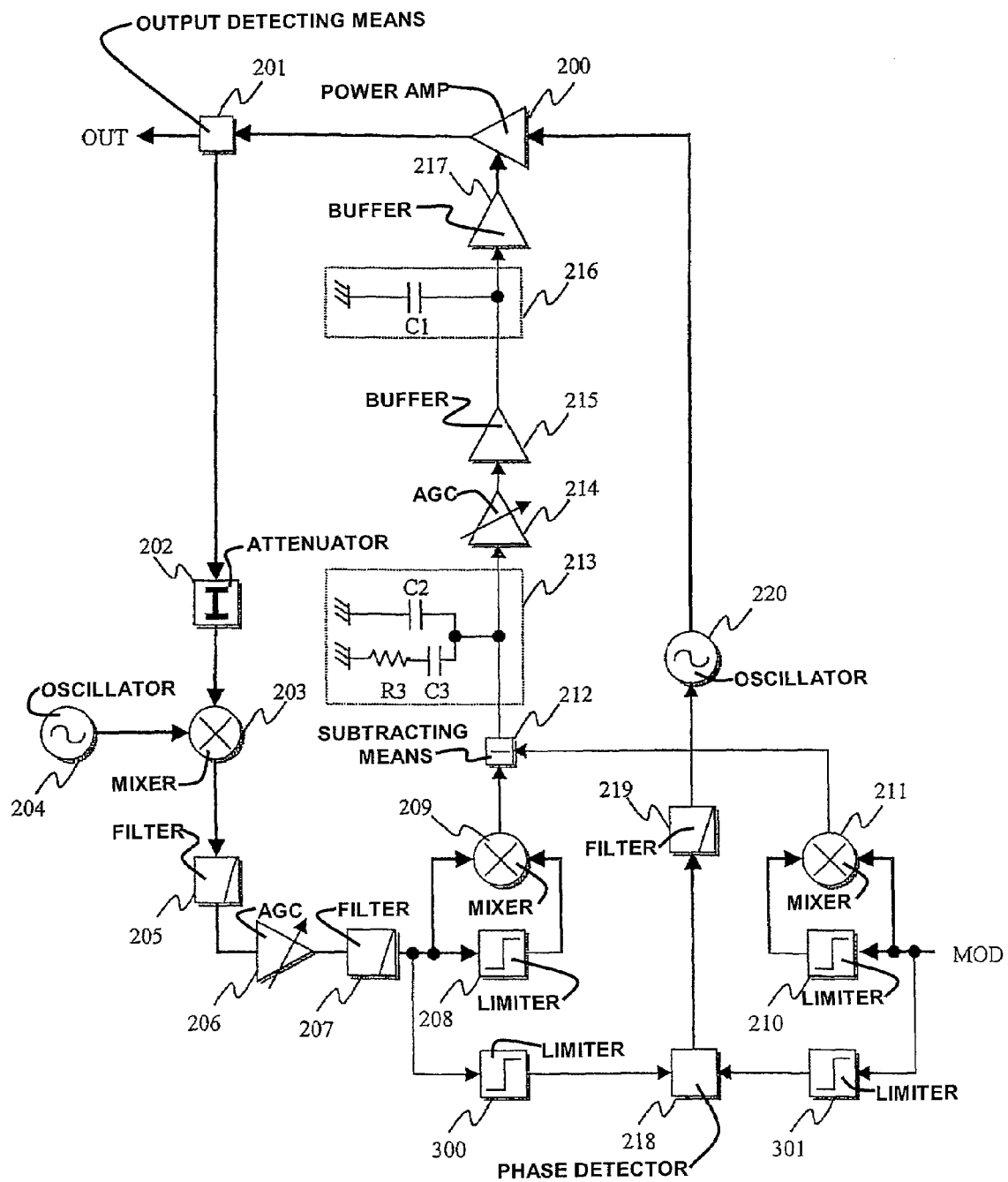
FIG. 4 is a block diagram showing another embodiment of the transmitter according to the present invention.

FIG. 4 is a configuration diagram showing the second embodiment of the transmitter according to the present invention. The transmitter according to the present embodiment employs a configuration in which the limiters 208 and 210 commonly utilized in the amplitude loop and the phase loop in the first embodiment are used for the amplitude loop and in which limiters 300 and 301 are added for the phase loop, such that each loop has the limiters. According to the present embodiment, it is advantageous that the respective characteristics of the limiters can be optimized for each loop.

Next, a third embodiment of the transmitter according to the present invention will be described.

Figure 5:
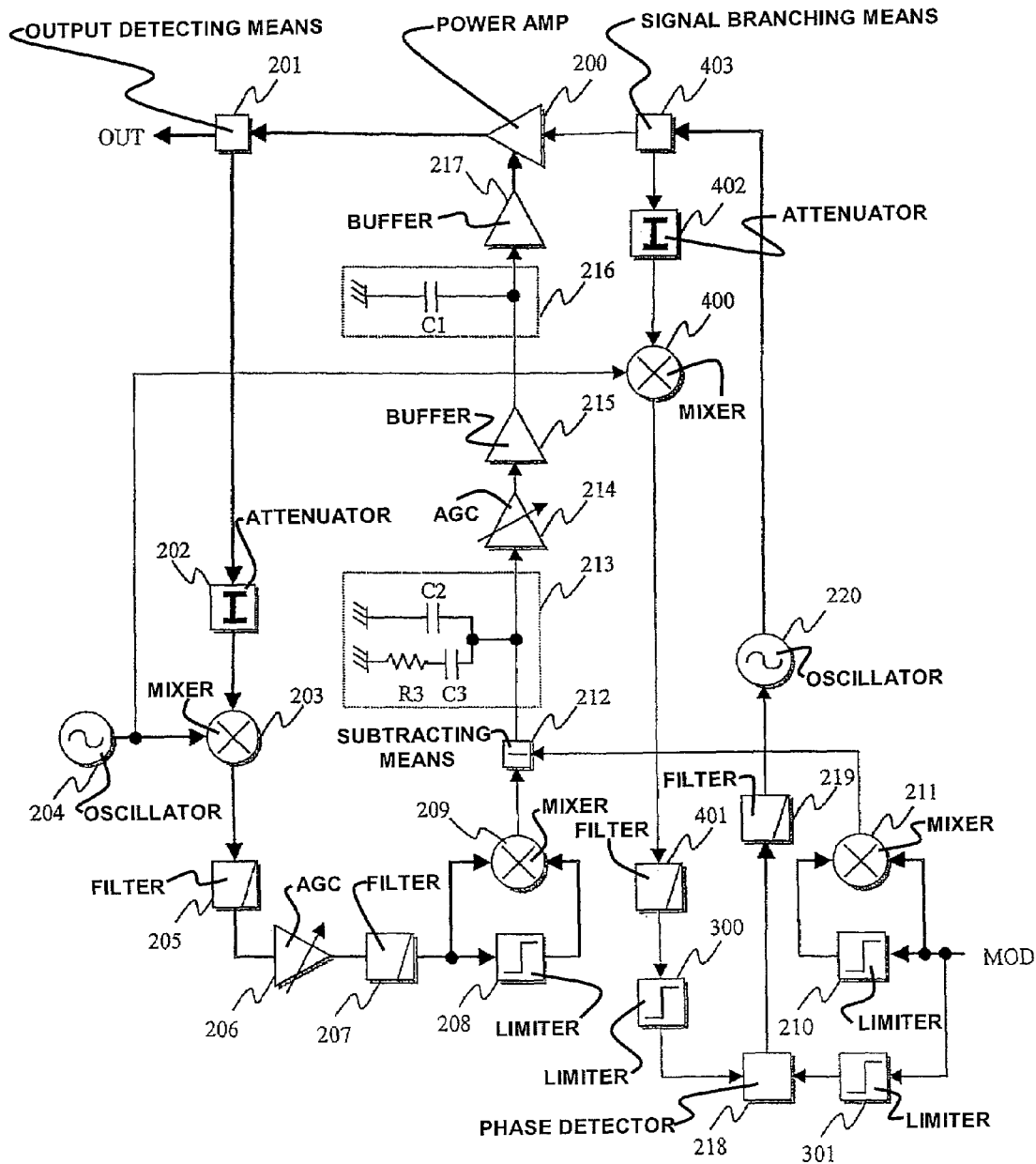
FIG. 5 is a block diagram showing still another embodiment of the transmitter according to the present invention.

FIG. 5 is a configuration diagram showing the third embodiment of the transmitter according to the present invention. In the second embodiment, the transmitter according to the present embodiment has a configuration in which second signal branching means 403 is inserted in the front stage of the power amplifier 200, that is, inserted between the transmission VCO 220 and the power amplifier 200; and a second attenuator 402 for attenuating the output of the signal branching means 403, a second mixer 400, and a filter 401 are provided; and the output of this filter 401 is fed back to the phase detector 218 via the limiter 300, so that the phase loop is configured separately from the amplitude loop. The local signal supplied to the second mixer 400 is in common used as the local signal to the mixer 203, and is supplied from the local VCO 204. The output signal of the mixer 400, whose undesired harmonics are suppressed in the filter 401, is supplied to the limiter 300.

Further, in the transmitter according to the present embodiment, the amplitude loop, namely, the mixer 203, the automatic gain controlled amplifiers 206 and 214, the current-output type mixers 209 and 211, the subtracting means 212, the current-output type buffer 215, and the buffer 217 are kept in non-operating states, only the phase loop is enabled to operate, and a predetermined fixed voltage corresponding to the output request level is applied to the output control terminal of the power amplifier 200, and thereby the transmitter is operated as a system similar to the aforementioned offset PLL architecture and can make the transmission of the GMSK modulation performed. Here, in order to apply the predetermined fixed voltage corresponding to the output request level to the output control terminal of the power amplifier 200, a configuration may be employed in which, for example, a changeover switch is provided between the buffer 217 and the output control terminal of the power amplifier 200 so that, for example, the control voltage VAPC supplied from the base band circuit 300 in place of the output of the buffer 217 is directly applied thereto.

Figure 6:
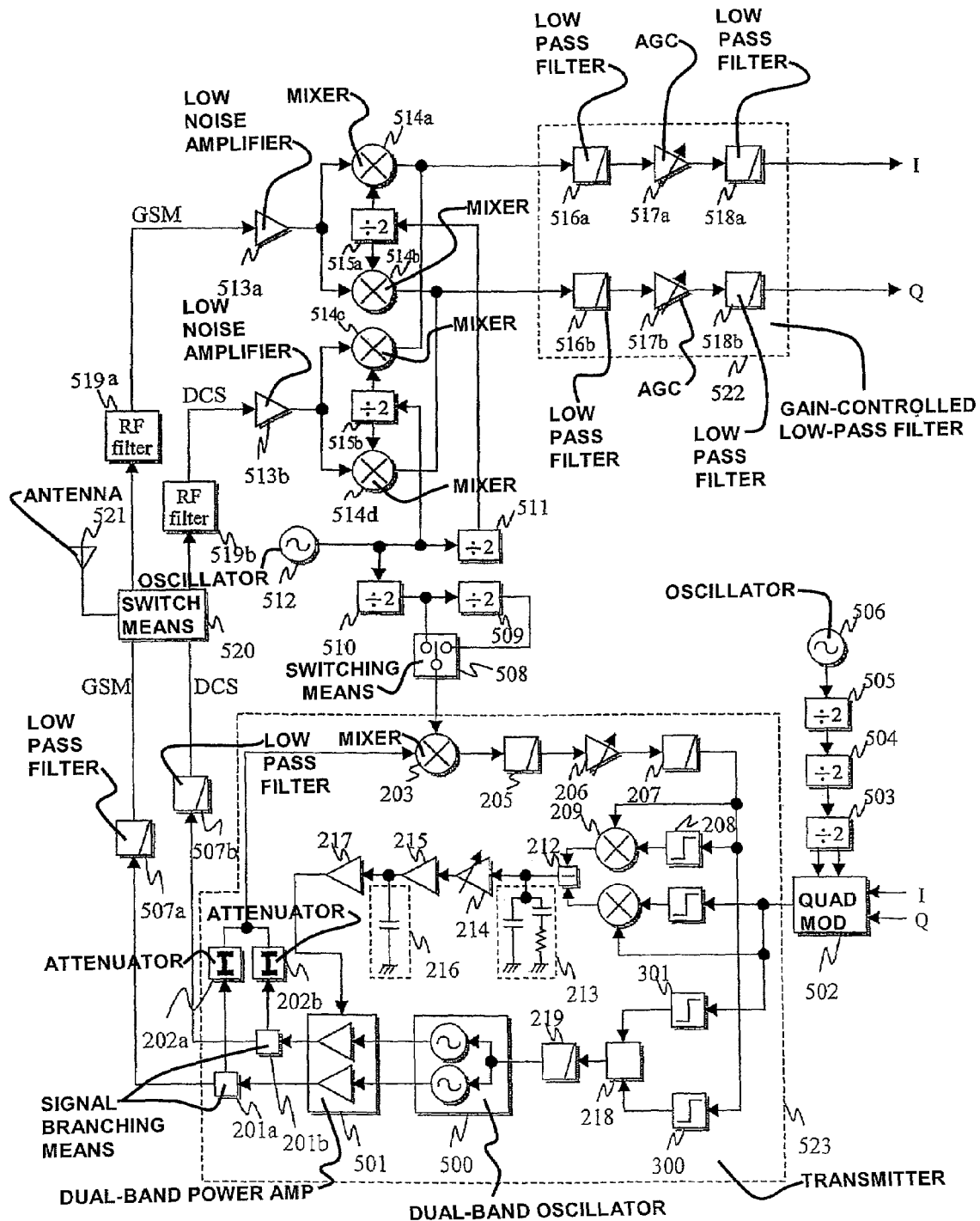
FIG. 6 is a block diagram showing an example of a wireless communication apparatus using the transmitter according to the present invention.

Next, an example, in which the second embodiment is applied to a transmitter for dual band and a wireless communication apparatus is configured by using the transmitter, will be described with reference to FIG. 6.

Here, as an example, the EDGE system for the dual bands of GSM900 and DCS1800 will be described. In the example shown in FIG. 6, though not particularly limited, a direct conversion architecture for directly converting a RF signal into a base band signal is employed in a receiving system circuit, and the second embodiment to which the polar-loop architecture is applied is employed in a transmitting system circuit.

The receiving system circuit is configured by RF filters 519a and 519b for passing through a desired reception band, low noise amplifiers 513a and 513b, mixers 514a, 514b, 514c and 514d, and an automatic gain controlled low pass filter 522. The RF filter 519a, the low noise amplifier 513a, and the mixers 514a and 514b are used for GSM900 while the RF filter 519b, the low noise amplifier 513b, and the mixers 514c and 514d are used for DCS1800. In the mixers 514a, 514b, 514c and 514d, the reception signal is frequency converted from the RF band to the base band, and, at the same time, a demodulation for separating the reception signal into a cosine component (I) and a sine component (Q) is also performed. Therefore, it is necessary that different local signals having a 90 degrees phase shift from each other are added to the mixers 514a and 514b, and, in this example, the local signals are generated by using the frequency divider 515a. Different local signals having a 90 degrees phase shift from each other are generated in the frequency divider 515b and are supplied also to the mixers 514c and 514d in a similar manner. The local signals are generated by an oscillator 512.

The oscillator 512 can oscillate within the range of at least 3580 MHz to 3980 MHz. In GSM900 mode, the oscillator 512 oscillates within the range of 3700 MHz to 3840 MHz, and the signal oscillated from the oscillator 512 is frequency-divided in 1850 MHz to 1920 MHz by the frequency divider 511 and then is frequency-divided in 925 MHz to 960 MHz by the frequency divider 515a, so that the reception band of GSM900 is all covered. Further, in DCS1800 mode, the oscillator 512 oscillates within the range of 3610 MHz to 3760 MHz, and the signal oscillated from the oscillator 512 is frequency-divided in 1805 MHz to 1880 MHz by the frequency divider 515b, so that the reception band of DCS1800 is all covered. The base band signals demodulated in the mixers 514a, 514b, 514c and 514d are input into the automatic gain controlled low pass filter 522 in which a level adjustment and a disturbance wave removal are performed. The automatic gain controlled low pass filter 522 is configured by the low pass filters 516a, 516b, 518a and 518b, and automatic gain controlled amplifiers AGC 517a and 517b.

The transmitting system circuit 523 is a circuit in which the second embodiment is configured as a transmitter for dual band. In order to realize the transmitter for dual band, a dual band oscillator 500 capable of oscillating in two bands of GSM900 band and DCS1800 band is employed in place of the transmission oscillator 220 shown in FIG. 1, and a dual band nonlinear power amplifier 501 for two bands of GSM900 band and DCS1800 band is employed in place of the nonlinear power amplifier 200 shown in FIG. 1. The dual band nonlinear power amplifier 501 has a first output terminal and a second output terminal, in which a signal is output from the first output terminal at GSM900 and a signal is output from the second output terminal at DCS1800.

Signal branching means 201a and 201b are connected to the first and second output terminals of the dual capable nonlinear power amplifier 501, respectively. The signal being input into the signal branching means 201a is branched into two, wherein one is supplied to a low pass filter 507a for suppressing undesired harmonics, and the other is input into the attenuator 202a. With respect to the signal input into the signal branching means 201b, one of the branched signals is supplied to the low pass filter 507b, and the other is input into the attenuator 202b. The output signals of the attenuators 202a and 202b are both input into the mixer 203.

The modulated signal MOD in this embodiment is generated by a quadrature modulator 502. In the quadrature modulator 502, the modulation by the I and Q signals is performed relative to the 80 MHz local signals having a 90 degrees phase shift from each other. The local signals are generated by using an oscillator 506 oscillating at 640 MHz and using the frequency dividers 503, 504 and 505.

In order to reduce the number of oscillators, the oscillator 512 is in common used for the transmitting system and the receiving system. At GSM900, the oscillator 512 oscillates within the range of 3840 MHz to 3980 MHz, and the output of the frequency divider 510 is in 1920 MHz to 1990 MHz, and the output of the frequency divider 509 is in 960 MHz to 995 MHz, and both outputs are used as the local signals of the mixer 203. At DCS1800, the oscillator 512 oscillates in the range of 3580 MHz to 3730 MHz, the output of the frequency divider 510 is within 1790 MHz to 1865 MHz, and the output is used as the local signal of the mixer 203. The change as to which one of the output signal of the frequency divider 509 and the output signal of the frequency divider 510 is used as the input signal of the mixer 203 is performed by switching means 508 which is controlled by the control signal from the base band circuit.

The inputs of the RF filters 519a and 519b and the outputs of the low pass filters 507a and 507b are switched by the switching means 520 for switching the respective connections between the antenna 521 and them. For example, at GSM900 transmission, the antenna 521 and the low pass filter 507a are connected with each other. Further, at GSM900 reception, the antenna 521 and the RF filter 519a are connected with each other.

As described above, the invention made by the present inventor or inventors has been specifically described on the basis of the embodiments, but the present invention is not limited to the above-mentioned embodiments and, needless to say, can be variously changed and modified without departing from the spirit thereof. For example, in the above embodiments, the filter with lag-lead characteristics having the capacitors C2 and C3 and the resistor R3 is employed as the first filter 213 on the forward path of the amplitude loop, but a filter may be used to which a resistor and a capacitor are connected in order to improve a little more the noise suppressed degree within such a range that the lag-lead characteristic of the first filter 213 are not largely changed.

As described above, the case has been described in which the present invention is applied to the system of dual band architecture capable of the communication according to two architectures of GSM architecture and DCS1800 architecture. However, in a system of triple band architecture which is configured such that the communication according to a PCS (Personal Communication System) 1900 architecture can be performed in addition to either the GSM architecture or the DCS architecture, or both, the present invention can be used even in the case where the communication depending on the phase modulation according to the 8-PSK modulation mode can be performed in addition to the GMSK modulation mode. 850 MHz (US band) can also be used.

What is claimed is:

1. A transmitter comprising:
a phase control loop for controlling a phase of a carrier being output from a transmission oscillator; and
an amplitude control loop for controlling an amplitude of a transmission being output signal output from a power amplifier,
wherein a filter provided on said amplitude control loop for restricting a frequency band of said amplitude control loop is configured by a first $2^{nd}$-order passive filter including a capacitor and a resistor and a second passive filter including only a capacitor, and active current-output circuits are provided at respective front stages of said first $2^{nd}$-order passive filter and said second passive filter to isolate the transfer functions of said first $2^{nd}$-order passive filter and said second passive filter.

2. A transmitter comprising:
a transmission oscillator for generating a carrier;
a power amplifier for amplifying a generated carrier signal;
a phase control loop which includes a phase detector for comparing a reference signal and a feedback signal and for outputting a signal corresponding to a phase difference thereof, and which controls a phase of the carrier being output from said transmission oscillator; and
an amplitude control loop which includes an amplitude detector for comparing a reference signal and a feedback signal and for outputting a signal corresponding to an amplitude difference thereof, and which controls an amplitude of a transmission being output signal output from said power amplifier,
wherein a filter provided on said amplitude control loop for restricting a frequency band of said amplitude control loop is configured by a first $2^{nd}$-order passive filter with lag-lead characteristics and a second passive filter of a perfect integrator, and active current-output circuits are provided at respective front stages of said first $2^{nd}$-order passive filter and said second passive filter to isolate the transfer functions of said first $2^{nd}$-order passive filter and said second passive filter.

3. The transmitter according to claim 1,
wherein in a first operating mode a phase and amplitude modulation by said phase control loop and said amplitude control loop is performed to transmit a signal; in a second operating mode a phase modulation by said phase control loop is performed to transmit a signal; and in said first operating mode and said second operating mode said phase control loop is in common used to perform a phase modulation.

4. The transmitter according to claim 3,
wherein said first $2^{nd}$ order passive filter is provided at a front stage thereof prior to said second passive filter.

5. The transmitter according to claim 4,
wherein said active current-output circuit provided at a front stage of said second passive filter is designed to configure a perfect integrator circuit comprising said active current-output circuit, said second passive filter, and a circuit provided at a rear stage of said second passive filter.

6. The transmitter according to claim 1,
wherein a first automatic gain controlled amplifier is provided on a feedback path from said power amplifier to an amplitude detector in said amplitude control loop; a second automatic gain controlled amplifier is provided on a forward path from said amplitude detector to said power amplifier in said amplitude control loop; and gains of said first and second automatic gain controlled amplifiers are controlled such that a product of the gain of said first automatic gain controlled amplifier and said gain of the second automatic gain controlled amplifier are kept approximately constant.

7. The transmitter according to claim 1,
wherein a bias is given such that said power amplifier is operated in a nonlinear area in both of first and second operating modes.

8. The transmitter according to claim 1,
wherein said power amplifier is configured by a field effect transistor, and a voltage generated in said amplitude control loop is applied to one of a drain and a source of said field effect transistor to control a gain of said transistor.

9. A wireless communication apparatus comprising the transmitter according to claim 1, a base band circuit for generating a base band signal on the basis of transmission data, and a modulator for performing a phase modulation and an amplitude modulation in accordance with a base band signal generated in said base band circuit.

10. The wireless communication apparatus according to claim 9, wherein a signal for controlling a gain of a first automatic gain controlled amplifier and a gain of a second automatic gain controlled amplifier is generated in said base band circuit.

* * * * *